US011189623B2

(12) United States Patent
Enomoto et al.

(10) Patent No.: US 11,189,623 B2
(45) Date of Patent: Nov. 30, 2021

(54) APPARATUSES, MEMORY DEVICES, AND ELECTRONIC SYSTEMS

(71) Applicant: Micron Technology, Inc., Boise, ID (US)

(72) Inventors: Oscar O. Enomoto, Manassas, VA (US); Chin Chuan Liu, Taichung (TW); Chia Wei Tsai, Taichung (TW); Yu Jen Lin, Taichung (TW)

(73) Assignee: Micron Technology, Inc., Boise, ID (US)

( * ) Notice: Subject to any disclaimer, the term of this patent is extended or adjusted under 35 U.S.C. 154(b) by 47 days.

(21) Appl. No.: 16/223,506

(22) Filed: Dec. 18, 2018

(65) Prior Publication Data
US 2020/0194438 A1 Jun. 18, 2020

(51) Int. Cl.
*H01L 27/108* (2006.01)

(52) U.S. Cl.
CPC .... *H01L 27/10876* (2013.01); *H01L 27/1085* (2013.01); *H01L 27/10823* (2013.01); *H01L 27/10891* (2013.01)

(58) Field of Classification Search
CPC ......... H01L 27/10876; H01L 27/10823; H01L 29/7813; H01L 29/7834; H01L 29/407
See application file for complete search history.

(56) References Cited

U.S. PATENT DOCUMENTS

| 4,222,062 | A | * | 9/1980 | Trotter | G11C 16/0416 257/316 |
| 4,949,136 | A | | 8/1990 | Jain | |
| 5,719,424 | A | | 2/1998 | Ahmad et al. | |
| 6,211,024 | B1 | | 4/2001 | Liu et al. | |
| 6,225,151 | B1 | * | 5/2001 | Gardner | H01L 21/26586 438/162 |
| 6,232,168 | B1 | | 5/2001 | Coursey | |
| 6,682,980 | B2 | * | 1/2004 | Chidambaram | H01L 21/26506 438/302 |
| 6,759,288 | B2 | | 7/2004 | Tran et al. | |
| 6,844,591 | B1 | | 1/2005 | Tran | |
| 8,035,160 | B2 | | 10/2011 | Beigel et al. | |
| 9,437,265 | B2 | * | 9/2016 | Iwasa | H01L 29/41766 |
| 2007/0048942 | A1 | | 3/2007 | Hanson et al. | |
| 2008/0057649 | A1 | | 3/2008 | Schuele et al. | |

(Continued)

*Primary Examiner* — Tuan A Hoang
(74) *Attorney, Agent, or Firm* — TraskBritt

(57) ABSTRACT

A method of forming an apparatus comprises forming filled trenches within a semiconductive structure having a well region comprising one or more dopants, the filled trenches extending into the well region and each individually comprising a conductive gate structure and a dielectric liner intervening between the conductive gate structure and the semiconductive structure. A fluorine-doped region is formed at junctions between the well region and additional regions of the semiconductive structure overlying the well region. The additional regions of the semiconductive structure are doped with one or more additional dopants having a different conductivity type than that of the one or more dopants of the well region after forming the fluorine-doped region. The semiconductive structure is annealed after doping the additional regions thereof. Apparatuses, memory devices, and electronic systems also described.

13 Claims, 7 Drawing Sheets

(56) References Cited

U.S. PATENT DOCUMENTS

| | | | |
|---|---|---|---|
| 2008/0191288 A1* | 8/2008 | Kwon | H01L 27/10894 257/383 |
| 2011/0133270 A1* | 6/2011 | Juengling | H01L 27/10823 257/331 |
| 2011/0169066 A1* | 7/2011 | Moon | H01L 27/10876 257/306 |
| 2012/0009772 A1 | 1/2012 | Mathew et al. | |
| 2012/0273859 A1 | 10/2012 | Oyu et al. | |
| 2015/0311217 A1 | 10/2015 | Chavan et al. | |

* cited by examiner

US 11,189,623 B2

APPARATUSES, MEMORY DEVICES, AND ELECTRONIC SYSTEMS

TECHNICAL FIELD

Embodiments of the disclosure relate to the field of semiconductor device design and fabrication. More specifically, embodiments of the disclosure relate to methods of forming an apparatus including fluorine-doped regions, and to related apparatuses, memory devices, and electronic systems.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs One example of a semiconductor device is a memory device. Memory devices are generally provided as internal integrated circuits in computers or other electronic devices. There are many species of memory including, but not limited to, random-access memory (RAM), read-only memory (ROM), dynamic random access memory (DRAM), synchronous dynamic random access memory (SDRAM), Flash memory, and resistance variable memory. Non-limiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes an access device (e.g., a transistor) and a memory storage structure (e.g., a capacitor) electrically coupled to the access device. The access device generally includes a channel region between a pair of source/drain regions, and a gate electrode configured to electrically connect the source/drain regions to one another through the channel region. Forming the access device normally requires precise delivery of controlled quantities of dopants into a semiconductive material to form the source/drain regions thereof. Ion implantation processes have increasingly replaced gaseous diffusion processes to facilitate such doping.

Unfortunately, thermal treatment (e.g., thermal annealing) processes employed to form conventional access devices and/or memory devices ran result in dopant diffusion that undesirably alters the locations of implanted dopant species. For example, during such thermal treatment processes, implanted P-type dopants (e.g., boron) and/or implanted N-type: dopants (e.g., phosphorus, arsenic) within different regions of a semiconductive material can undesirably diffuse into other regions of the semiconductive material, making it difficult to maintain desirable dopant concentration profiles and negatively impacting electrical properties (e.g., junction leakage, channel resistance, drive current, row decoder enable (rdE) signals) of conventional access devices and conventional memory devices employing the semiconductive material.

A need, therefore, exists for new, simple, and cost-efficient methods of forming apparatuses that alleviate one or more of the aforementioned problems, as well as new apparatuses, semiconductor devices (e.g., memory devices, such as DRAM devices), and electronic systems.

DETAILED DESCRIPTION

Figure 1A:
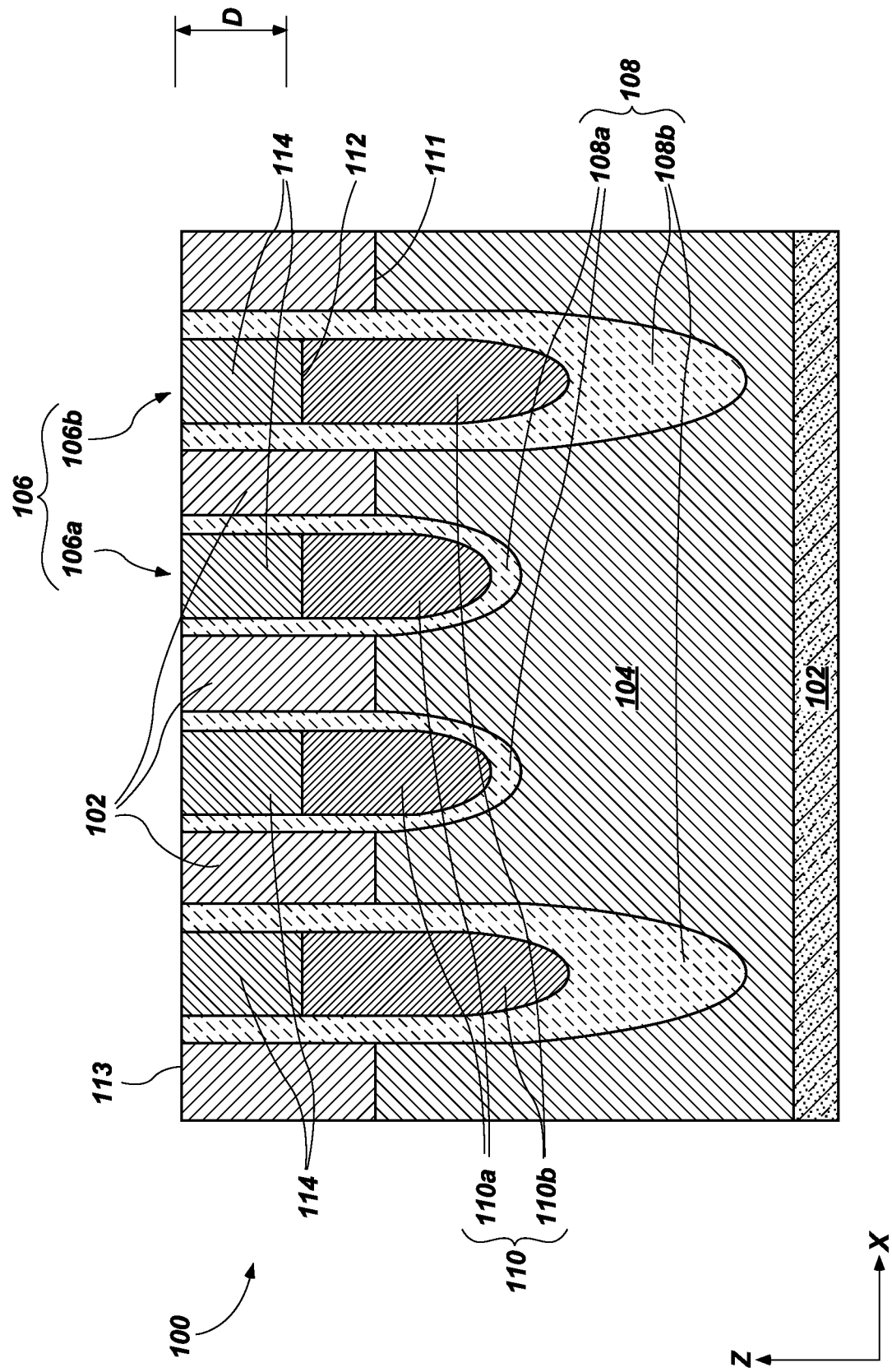
FIGS. 1A through 1E are simplified, partial cross-sectional views illustrating a method of forming an apparatus, in accordance with embodiments of the disclosure.

Methods of forming apparatuses are described herein, as are related apparatuses, memory devices, and electronic systems. In some embodiments, a method of forming an apparatus comprises forming filled trenches within a semiconductive structure exhibiting a well region including one or more dopants having a first conductivity type (e.g., P-type dopants or N-type dopants). The filled trenches vertically extend into the well region and each individually include a gate structure (e.g., a gate electrode) and a dielectric liner (e.g., a dielectric oxide liner) intervening between the gate structure and the semiconductive structure. A fluorine-doped region (e.g., fluorine-enhanced region) is formed at junctions (e.g., interfaces) between the well region and additional regions of the semiconductive structure vertically overlying the well region. After forming the fluorine-doped region, the additional regions of the semiconductive structure are doped with one or more additional dopants having a second conductivity type different than that of the first conductivity type of the one or more dopants of the well region. The semiconductive structure is then subjected to a thermal treatment process (e.g., a thermal annealing process) after doping the additional regions thereof. During the thermal treatment process, the fluorine-doped region impedes (e.g., substantially prevents) the dopants within the well region of the semiconductive structure from diffusing into the additional regions of the semiconductive structure, and also impedes (e.g., substantially prevents) the additional dopants within the additional region of the semiconductive structure from diffusing into the well region of the semiconductive structure. The methods of the disclosure may facilitate one or more of increased performance, increased efficiency, increased reliability, and increased durability in apparatuses, semiconductor devices (e.g., memory devices, such as DRAM devices), and electronic systems as compared to conventional apparatuses, conventional semiconductor devices, and conventional electronic systems.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, reference to a feature as being "over" an additional feature means and includes the feature being directly on top of, adjacent to (e.g., laterally adjacent to, vertically adjacent to), underneath, or in direct contact with the additional feature. It also includes the element being indirectly on top of, adjacent to (e.g., laterally adjacent to, vertically adjacent to), underneath, or near the additional feature, with other features located therebetween. In contrast, when an element is referred to as being "on" or another element, there are no intervening features therebetween.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization, or other known methods.

FIGS. 1A through 1E are simplified partial cross-sectional views illustrating embodiments of a method of forming an apparatus (e.g., a semiconductor device, such as a DRAM device). With the description provided below, it will be readily apparent to one of ordinary skill in the art that the methods described herein may be used in various devices. In other words, the methods of the disclosure may be used whenever it is desired to form an apparatus.

Referring to FIG. 1A, an apparatus 100 may include a semiconductive structure 102 including a well region 104 therein, and filled trenches 106 (e.g., in the Z-direction) vertically extending into the semiconductive structure 102. The filled trenches 106 may each individually vertically extend into the well region 104 of the semiconductive structure 102, and may horizontally intervene (e.g., in the X-direction) between pillar-shaped portions of the semiconductive structure 102. As shown in FIG. 1A, the filled trenches 106 may include dielectric liners 108 on or over surfaces of the semiconductive structure 102 defining boundaries of the filled trenches 106, gate structures 110 on or over lower portions of inner surfaces of the dielectric liners 108, and insulative caps 114 on or over upper surfaces of the gate structures 110 and on or over upper portions of the inner surfaces of the dielectric liners 108.

The semiconductive structure 102 may be formed of and include of semiconductive material, such as one or more of a silicon material, a silicon-germanium material, a germanium material, a gallium arsenide material, a gallium nitride material, and an indium phosphide material. By way of non-limiting example, the semiconductive structure 102 may be formed of and include at least one silicon material. As used herein, the term "silicon material" means and includes a material that includes elemental silicon or a compound of silicon. The semiconductive structure 102 may, for example, be formed of and include one or more monocrystalline silicon and polycrystalline silicon. In some embodiments, the semiconductive structure 102 comprises polycrystalline silicon. Regions of the semiconductive structure 102 outside of boundaries of the well region 104 may be doped (e.g., conductively doped) or may be undoped.

The well region 104 (e.g., array well) of the semiconductive structure 102 comprises a conductively-doped region of the semiconductive structure 102. The well region 104 of the semiconductive structure 102 may, for example, be doped with at least one P-type dopant (e.g., one or more of boron, aluminum, and gallium). Thus, the well region 104 may comprise a P-well exhibiting deficiencies of valence electrons (commonly referred to as "holes"). In some such embodiments, one or more regions of the semiconductive structure 102 surrounding the well region 104 (e.g., P-well) may be doped with at least one N-type dopant (e.g., one or more of phosphorus, arsenic, antimony, and bismuth). In additional embodiments, the well region 104 of the semiconductive structure 102 may, for example, be doped with at least one N-type dopant (e.g., one or more of phosphorus, arsenic, antimony, and bismuth). Thus, the well region 104 may comprise an N-well exhibiting excesses of free electrons. In some such additional embodiments, one or more regions of the semiconductive structure 102 surrounding the well region 104 (e.g., N-well) may be doped with at least one P-type dopant (e.g., one or more of boron, aluminum, and gallium). In some embodiments, the well region 104 of the semiconductive structure 102 is doped with boron.

The well region 104 may have substantially homogeneous distribution of the dopant (e.g., the P-type dopant or the N-type dopant) thereof, or may have a heterogeneous distribution of the dopant. In some embodiments, the well region 104 exhibits heterogeneous distribution of the dopant thereof, such that the well region 104 exhibits a substantially non-uniform (e.g., non-even, variable) distribution of the dopant. For example, amounts (e.g., atomic concentrations) of the dopant included in the well region 104 may vary (e.g., increase, decrease) throughout vertical dimensions (e.g., in the Z-direction) of the well region 104. In additional embodiments, the well region 104 exhibits a substantially homogeneous distribution of the dopant thereof, such that the well region 104 exhibits a substantially uniform (e.g., even, non-variable) distribution of the dopant thereof. For example, amounts (e.g., atomic concentrations) of the dopant included in the well region 104 may not substantially vary throughout the dimensions (e.g., vertical dimensions, horizontal dimensions) of the well region 104.

With continued reference to FIG. 1A, the filled trenches 106 may include first filled trenches 106a and second filled trenches 106b, wherein the second filled trenches 106b have different configurations than the first filled trenches 106a. For example, the second filled trenches 106b may vertically extend (e.g., in the Z-direction) to a different (e.g., lower, deeper) depth within the semiconductive structure 102 (e.g., within the well region 104 thereof), and may exhibit one or more different configurations (e.g., different dimensions, different shapes, different material compositions) of one or more of the components thereof, as described in further detail below. The second filled trenches 106b may, for example, serve as shallow trench isolation (STI) structures for the apparatus 100.

As shown in FIG. 1A, in some embodiments, the apparatus 100 includes two (2) (e.g., a pair) of the first filled trenches 106a positioned laterally between (e.g., in the X-direction) two (2) (e.g., a pair) of the second filled trenches 106b. Put another way, a pair of the second filled trenches 106b may laterally flank a pair of the first filled trenches 106a. In additional embodiments, the apparatus 100 may include one or more of a different quantity and a different arrangement of one or more of the first filled trenches 106a and the second filled trenches 106b. As a non-limiting example, the apparatus 100 may include a different quantity of the first filled trenches 106a positioned laterally between two (2) of the second filled trenches 106b, such as a single (e.g., only one) filled trench 106a, or more than two (2) (e.g., three (3), four (4), or more than four (4)) first filled trenches 106a. As another non-limiting example, the apparatus 100 may include a different quantity and arrangement of the second filled trenches 106b, such as three (3) or more of the second filled trenches 106b in a laterally alternating (e.g., in the X-direction) arrangement with two (2) or more of the first filled trenches 106a. As a further non-limiting example, the second filled trenches 106b may be completely omitted (e.g., absent), such that the apparatus 100 includes the first filled trenches 106a but not the second filled trenches 106b. In such embodiments, the apparatus 100 may be formed to include more of the first filled trenches 106a in place of the omitted second filled trenches 106b.

With continued reference to FIG. 1A, the dielectric liners 108 may substantially surround side surfaces and bottom surfaces of the gate structures 110 within the filled trenches 106, and may also substantially surround side surfaces of the insulative caps 114 within the filled trenches 106. As shown in FIG. 1A, the first filled trenches 106a may include first dielectric liners 108a, and the second filled trenches 106b may include second dielectric liners 108b. The dielectric liners 108 may intervene between surfaces of the semiconductive structure 102 (including surfaces of the well region 104 thereof) defining the boundaries of the filled trenches 106 and surfaces of the gate structures 110 and the insulative caps 114 opposing such surfaces of the semiconductive structure 102.

The dielectric liners 108 (including first dielectric liners 108a and the second dielectric liners 108b) may be formed of and include at least one dielectric material (e.g., at least one dielectric oxide material), such as one or more of silicon dioxide ($SiO_2$), phosphosilicate glass, borosilicate glass, borophosphosilicate glass, fluorosilicate glass, aluminum oxide, and a high-k oxide (e.g., hafnium oxide ($HfO_x$), niobium oxide ($NbO_x$), titanium oxide ($TiO_x$)). In some embodiments, the dielectric liners 108 are formed of and include $SiO_2$.

Each of the dielectric liners 108 may exhibit substantially the same dimensions and shape as each other of the dielectric liners 108, or at least some of the dielectric liners 108 may exhibit one or more of different dimensions and different shapes than at least some other of the dielectric liners 108. As a non-limiting example, the thicknesses and thickness uniformities of the first dielectric liners 108a within the first filled trenches 106a may be different than the thicknesses and thickness uniformities of the second dielectric liners 108b within the second filled trenches 106b. The second dielectric liners 108b of the second filled trenches 106b may, for example, be thicker than the first filled trenches 106a at least at lower portions of the second filled trenches 106b relative to lower portions of the first filled trenches 106a. The increased thickness of the second dielectric liners 108b, in conjunction with the relatively greater depth (e.g., into the well region 104 of the semiconductive structure 102) of the second filled trenches 106b as compared to the first filled trenches 106a, may at least partially facilitate desired electrical isolation characteristics of the second filled trenches 106b for the apparatus 100.

The gate structures 110 may each individually extend from and between opposing inner surfaces of the dielectric liner 108 adjacent thereto in a first lateral direction (e.g., the X-direction). In addition, the gate structures 110 may extend substantially parallel to one another in a second lateral direction substantially orthogonal to the first lateral direction. The first filled trenches 106a may include first gate structures 110a, and the second filled trenches 106b may include second gate structures 110b. As shown in FIG. 1A, a portion (e.g., lower portion) of each of the gate structures 110 may be located within the vertical boundaries of the well region 104 of the semiconductive structure 102, and another portion (e.g., upper portion) of each of the gate structures 110 may be located outside (e.g., above) the vertical boundaries of the well region 104 of the semiconductive structure 102. Uppermost surfaces 112 of the gate structures 110 may vertically underlie uppermost surfaces 113 of the semiconductive structure 102 and may vertically overlie uppermost boundaries 111 of the well region 104 of the semiconductive structure 102. As a non-limiting example, the uppermost surfaces 112 of the gate structures 110 may be vertically recessed from the uppermost surfaces 113 of the semiconductive structure 102 by a distance D within a range of from about 55 nm and about 70 nm, such as from about 60 nm to about 65 nm. In some embodiments, the uppermost surfaces 112 of the gate structures 110 are vertically recessed from the uppermost surfaces 113 of the semiconductive structure 102 by about 65 nm.

The gate structures 110 (including the first gate structures 110a and the second gate structures 110b) may be formed of and include at least one electrically conductive material, such as one or more of a metal, a metal alloy, a conductive metal oxide, a conductive metal nitride, a conductive metal silicide, and a conductively doped semiconductive material. The gate structures 110 may, for example, be formed of and include one or more of ruthenium (Ru), tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride (TiN), titanium silicide (TiSi), titanium silicon nitride (TiSiN), titanium aluminum nitride (TiAlN), molybdenum nitride (MoN), iridium (Ir), iridium oxide ($IrO_x$), ruthenium oxide ($RuO_x$), ruthenium titanium nitride (RuTiN), and conductively doped silicon. In some embodiments, the gate structures 110 are each formed of and include TiN. In additional embodiments, the second gate structures 110b of the second filled trenches 106b may be formed of and include (or may otherwise be replaced with) a dielectric material, such as one or more of a dielectric oxide material (e.g., $SiO_2$; phosphosilicate glass; borosilicate glass; borophosphosilicate glass; fluorosilicate glass; aluminum oxide; high-k oxides, such as $HfO_x$; a combination thereof), a dielectric nitride material (e.g., silicon nitride (SiN)), a dielectric oxynitride material (e.g., silicon oxynitride (SiON)), a dielectric carbonitride material (e.g., silicon carbonitride (SiCN)), a dielectric carboxynitride material (e.g., silicon carboxynitride (SiOCN)), and amphorous carbon.

Each of the gate structures 110 may individually exhibit any desired dimensions and shape compatible with the boundaries of the filled trenches 106 and the dimensions and shapes of the other components (e.g., the dielectric liners 108, the insulative caps 114) of the filled trenches 106. Each of the gate structures 110 may exhibit substantially the same dimensions and substantially the same shape as each other of the gate structures 110, or at least some of the gate structures 110 (e.g., the second gate structures 110b) may exhibit one or more of different dimensions and different shapes than at least some other of the gate structures 110 (e.g., the first gate structures 110a).

With continued reference to FIG. 1A, the insulative caps 114 may overlie the gate structures 110, and may each individually extend from and between opposing inner surfaces of the dielectric liner 108 adjacent thereto in a first lateral direction (e.g., the X-direction). In addition, the insulative caps 114 may extend substantially parallel to one another in a second lateral direction substantially orthogonal to the first lateral direction. As shown in FIG. 1A, uppermost surfaces of the insulative caps 114 may be substantially coplanar with the uppermost surfaces 113 of the semiconductive structure 102. In further embodiments, the uppermost surfaces of the insulative caps 114 may be vertically offset (e.g., vertically underlie, vertically overlie) from the uppermost surfaces 113 of the semiconductive structure 102.

The insulative caps 114 are formed of and include at least one dielectric material, such as one or more of a dielectric oxide material (e.g., $SiO_2$; phosphosilicate glass; borosilicate glass; borophosphosilicate glass; fluorosilicate glass; aluminum oxide; high-k oxides, such as $HfO_x$; a combination thereof), a dielectric nitride material (e.g., SiN), a dielectric oxynitride material (e.g., SiON), a dielectric carbonitride material (e.g., SiCN), and a dielectric carboxynitride material (e.g., SiOCN), and amphorous carbon. In some embodiments, the insulative caps 114 are formed of and include SiN.

Each of the insulative caps 114 may individually exhibit any desired dimensions and shape compatible with the boundaries of the filled trenches 106 and the dimensions and shapes of the other components (e.g., the dielectric liners 108, the gate structures 110) of the filled trenches 106. Each of the insulative caps 114 may exhibit substantially the same dimensions and substantially the same shape as each other of the insulative caps 114, or at least some of the insulative caps 114 may exhibit one or more different dimensions and different shapes than at least some other of the insulative caps 114.

The semiconductive structure 102 (including the well region 104 thereof) and the filled trenches 106 (including the dielectric liners 108, the gate structures 110, and the insulative caps 114 thereof) vertically extending into the semiconductive structure 102 may be formed using conventional processes (e.g., conventional deposition processes, such as one or more of in situ growth, spin-on coating, blanket coating, chemical vapor deposition (CVD), plasma enhanced chemical vapor deposition (PECVD), atomic layer deposition (ALD), and physical vapor deposition (PVD); conventional material removal processes, such as conventional photolithography processes and conventional etching processes; conventional doping processes, such as ion implantation processes and dopant diffusion processes), which are not described in detail herein.

Figure 1B:
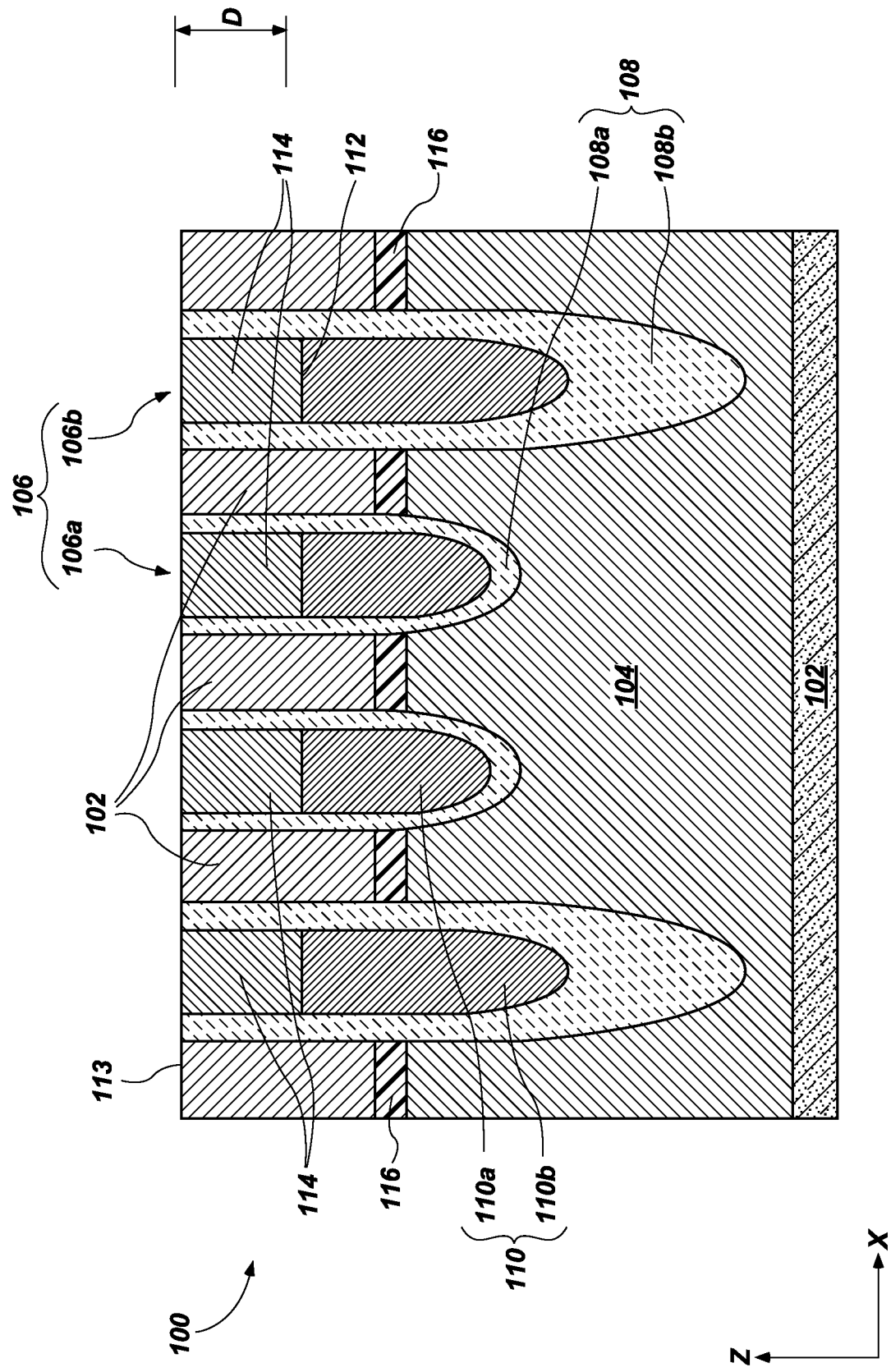

Referring next to FIG. 1B, the semiconductive structure 102 may be doped with fluorine at and/or proximate (e.g., directly vertically above, directly vertically below) the uppermost boundaries 111 (FIG. 1A) of the well region 104 to form a fluorine-doped region 116 (e.g., fluorine-enriched region) of the semiconductive structure 102. As shown in FIG. 1B, the fluorine-doped region 116 may be formed at the junction (e.g., interface, boundary) between the well region 104 and additional regions (e.g., regions to become source/drain regions following subsequent processing) of the semiconductive structure 102 thereover. The fluorine-doped region 116 may vertically intervene between the well region 104 of the semiconductive structure 102 and the additional regions of the semiconductive structure 102 thereover. In some embodiments, the fluorine-doped region 116 is formed to have a concentration of fluorine within a range of from about 1E17 units (e.g., atoms, ions) of fluorine per cubic centimeter ($cm^3$) to about 5E18 units of fluorine per $cm^3$. The fluorine-doped region 116 may impede or even substantially prevent undesirable migration (e.g., diffusion) of dopants (e.g., P-type dopants, N-type dopants) out of and/or into the well region 104 during subsequent processing (e.g., thermal annealing) acts, to facilitate and/or improve one or more desirable electrical properties, as described in further detail below.

The fluorine-doped region 116 may be formed to exhibit a substantially homogeneous distribution of fluorine, or may be formed to exhibit a heterogeneous distribution of fluorine. In some embodiments, the fluorine-doped region 116 is formed to exhibit a heterogeneous (e.g., non-uniform, non-even, variable) distribution of fluorine. For example, amounts (e.g., atomic concentrations) of fluorine included in the fluorine-doped region 116 may vary (e.g., increase, decrease) throughout vertical dimensions (e.g., in the Z-direction) of the fluorine-doped region 116. In additional embodiments, the fluorine-doped region 116 is formed to exhibits a substantially homogeneous (e.g., uniform, even, non-variable) distribution of fluorine. For example, amounts (e.g., atomic concentrations) of fluorine included in fluorine-doped region 116 may not substantially vary throughout the vertical dimensions (e.g., in the Z-direction) of the fluorine-doped region 116.

The fluorine-doped region 116 may be formed using conventional processes (e.g., conventional implantation processes), which are not described in detail herein. By way of non-limiting example, one or more fluorine-containing species (e.g., fluorine atoms, fluorine-containing molecules, fluoride ions, fluorine-containing ions) may be implanted into the semiconductive structure 102 at and/or proximate the uppermost boundaries 111 (FIG. 1A) of the well region 104 to form the fluorine-doped region 116. The fluorine-containing species may, for example, comprise one more of fluoride ions ($F^-$), fluoroboron ions ($BF^+$), and difluoroboron ions ($BF_2^+$). In some embodiments, the implantation process is an ion implantation process employing an medium current (MC) implanter apparatus configured and operated to supply an implantation dose of 1.1E14 fluorine-containing ions per square centimeter ($cm^2$) from a fluorine-containing source (e.g., a boron fluoride target) using an acceleration voltage of about 80 kilo-electronvolts (KeV).

Figure 1C:
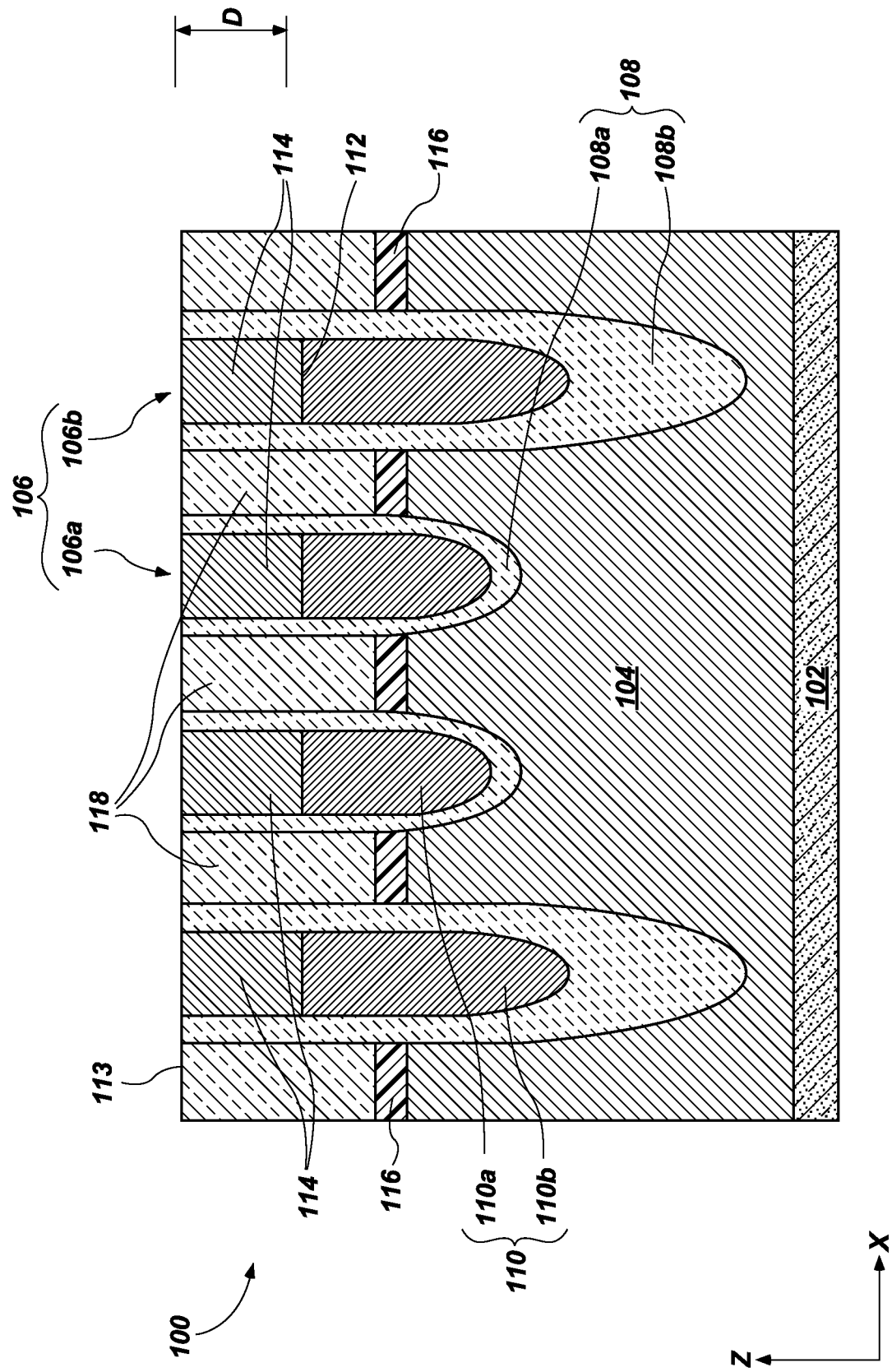

Referring next to FIG. 1C, the regions of the semiconductive structure 102 overlying the fluorine-doped region 116 may be at least partially doped with at least one dopant (e.g., impurity) having a conductivity type opposite that of the dopant within the well region 104, to form dopant diffusion regions 118 of semiconductive structure 102. For example, if the well region 104 (e.g., P-well) is doped with at least one P-type dopant (e.g., one or more of boron, aluminum, and gallium), the dopant diffusion regions 118 may be formed to be doped (e.g., relatively lightly doped) with at least one N-type dopant (e.g., one or more of phosphorus, arsenic, antimony, and bismuth). As another example, if the well region 104 (e.g., N-well) is doped with at least one N-type dopant (e.g., one or more of phosphorus, arsenic, antimony, and bismuth), the dopant diffusion regions 118 may be formed to be doped (e.g., relatively lightly doped) with at least one P-type dopant (e.g., one or more of boron, aluminum, and gallium). In some embodiments, such as embodiments wherein the well region 104 is doped with boron, the dopant diffusion regions 118 are formed to be at least partially doped with phosphorus.

Referring next to FIG. 1C, the regions of the semiconductive structure 102 overlying the fluorine-doped region 116 may be at least partially doped with at least one dopant (e.g., at least one N-type dopant, such as phosphorus) using conventional processes (e.g., conventional implantation processes, conventional diffusion processes), which are not described in detail herein. By way of non-limiting example, one or more phosphorus-containing species (e.g., phosphorus atoms, phosphorus-containing molecules, phosphide ions, phosphorus-containing ions) may be implanted into the regions of semiconductive structure 102 overlying the fluorine-doped region 116 to form the dopant diffusion regions 118. The phosphorus-containing species may, for example, comprise phosphide ions ($P^3$). In some embodiments, the implantation process is an ion implantation process employing a MC implanter apparatus configured and operated to supply an implantation dose of 3.0E13 phosphorus-containing ions/$cm^2$ from a phosphorus-containing source using an acceleration voltage of about 10 KeV.

Figure 1D:
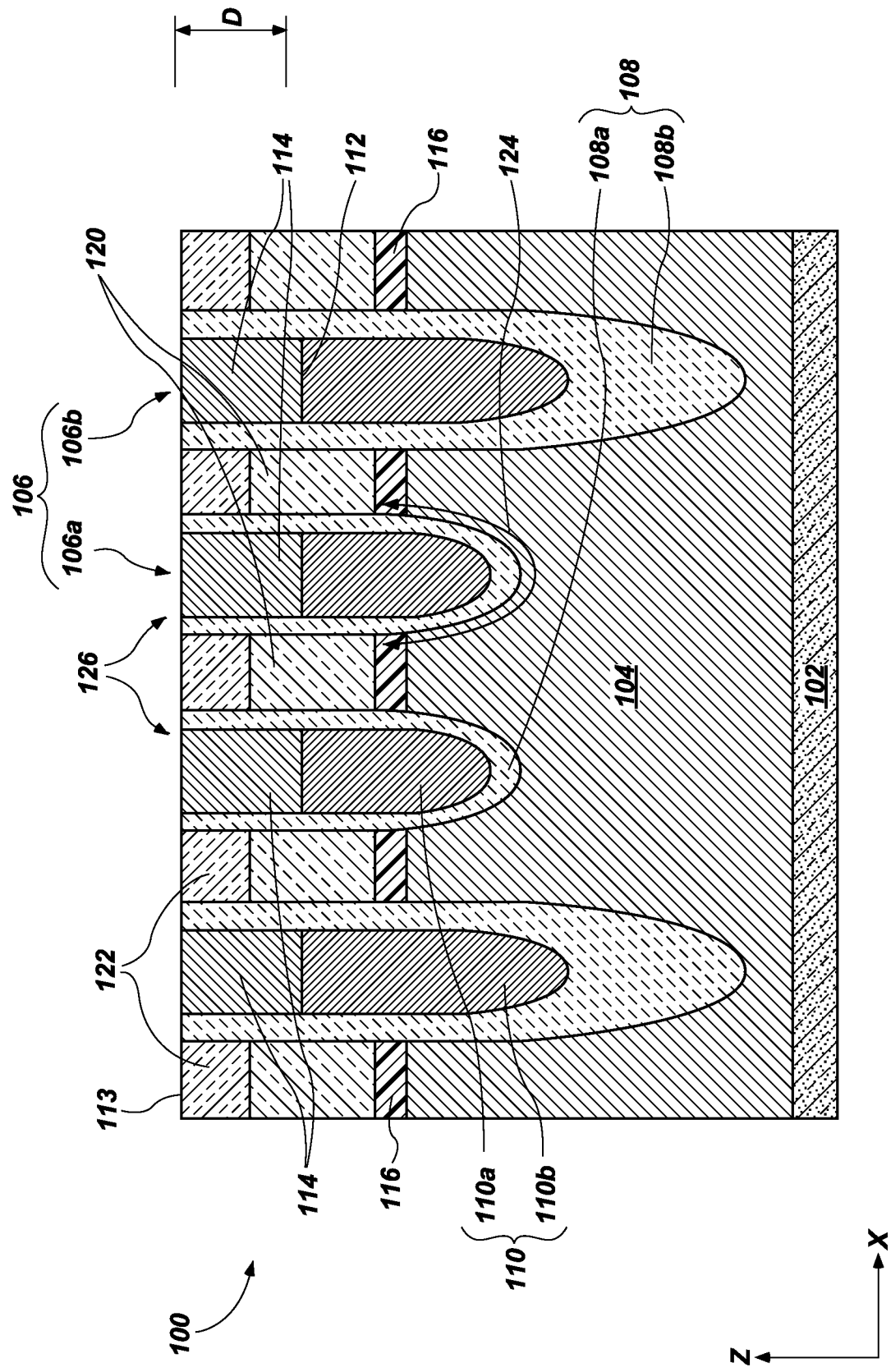

Referring next to FIG. 1D, the dopant diffusion regions 118 (FIG. 1C) of the semiconductive structure 102 may be doped with at least one additional dopant having the same conductivity type as the dopant previously employed to form the dopant diffusion regions 118 (FIG. 1C), and then the apparatus 100 may be subjected to a thermal treatment (e.g., thermal annealing) process to form lightly doped drain (LDD) regions 120 and source/drain regions 122 within the semiconductive structure 102. As shown in FIG. 1D, the LDD regions 120 may vertically overlie the fluorine-doped region 116, and the source/drain regions 122 may vertically overlie the LDD regions 120.

The additional dopant delivered (e.g., implanted, diffused) into the dopant diffusion regions 118 (FIG. 1C) may have a conductivity type opposite that of the dopant within the well region 104. For example, if the well region 104 (e.g., P-well) is doped with at least one P-type dopant (e.g., one or more of boron, aluminum, and gallium) and the dopant diffusion regions 118 (FIG. 1C) are doped with at least one N-type dopant (e.g., one or more of phosphorus, arsenic, antimony, and bismuth), the dopant diffusion regions 118 (FIG. 1C) may be further doped with at least one additional N-type dopant (e.g., one or more of phosphorus, arsenic, antimony, and bismuth). As another example, if the well region 104 (e.g., N-well) is doped with at least one N-type dopant (e.g., one or more of phosphorus, arsenic, antimony, and bismuth) and the dopant diffusion regions 118 (FIG. 1C) are doped with at least one P-type dopant (e.g., one or more of boron, aluminum, and gallium), the dopant diffusion regions 118 (FIG. 1C) may be further doped with at least one additional P-type dopant (e.g., one or more of boron, aluminum, and gallium). In some embodiments, such as embodiments wherein the well region 104 is doped with boron and the dopant diffusion regions 118 (FIG. 1C) are doped with phosphorous, the dopant diffusion regions 118 (FIG. 1C) are further doped with arsenic.

The dopant diffusion regions 118 (FIG. 1C) may be further doped with at least one additional dopant (e.g., at least one additional N-type dopant, such as arsenic) using conventional processes (e.g., conventional implantation processes, conventional diffusion processes), which are not described in detail herein. By way of non-limiting example, one or more arsenic-containing species (e.g., arsenic atoms, arsenic-containing molecules, arsenic ions, arsenic-containing ions) may be implanted into one or more portions of the dopant diffusion regions 118 (FIG. 1C). The arsenic-containing species may, for example, comprise arsenic ions (As$^{3+}$). In some embodiments, the implantation process is an ion implantation process employing a MC implanter apparatus configured and operated to supply an implantation dose of 7.0E14 arsenic-containing ions/cm$^2$ from an arsenic-containing source using an acceleration voltage of about 25 KeV.

The thermal treatment (e.g., rapid thermal annealing (RTA)) process may subject the apparatus 100 to one or more elevated temperatures (e.g., one or more temperatures greater than or equal to about 600° C., such as within a range of from about 600° C. to about 850° C.) for a sufficient period of time (e.g., greater than or equal to about 10 seconds, such as from about 10 seconds to about 60 seconds) to diffuse and/or activate the various dopants (e.g., N-type dopants, P-type dopants, fluorine) thereof throughout the semiconductive structure 102 in a desired manner. For example, the thermal treatment process may facilitate the diffusion and/or activation of dopants (e.g., N-type dopants, such as phosphorous and arsenic) within the dopant diffusion regions 118 (FIG. 1C) to form the LDD regions 120 and the source/drain regions 122. The source/drain regions 122 may be formed to exhibit a relatively higher concentration of dopants (e.g., N-type dopants) than the LDD regions 120. In some embodiments, a concentration of dopants (e.g., N-type dopants) within the LDD regions 120 is within a range of from about 1E18 units (e.g., atoms, ions) of the dopant species per cm$^3$ to about 5E19 units of the dopant species per cm$^3$. The thermal treatment process may also effectuate the diffusion of dopants (e.g., P-type dopants, such as boron) within the well region 104. Following the thermal treatment process the well region 104 may exhibit a heterogeneous distribution of the dopant or a substantially homogeneous distribution of the dopant. In addition, fluorine from the fluorine-doped region 116 may diffuse into the source/drain regions 122, the LDD regions 120, and the well region 104 of the semiconductive structure 102 during the thermal treatment process. Following the thermal treatment process the semiconductive structure 102 may exhibit a heterogeneous distribution of fluorine throughout at least the vertical dimensions (e.g., in the Z-direction) thereof.

During the thermal treatment process the fluorine-doped region 116 may impede (e.g., substantially inhibit, substantially prevent) the diffusion of dopants from the well region 104 into the dopant diffusion regions 118 (FIG. 1C), and may also impede (e.g., substantially inhibit, substantially prevent) the diffusion of dopants from the dopant diffusion regions 118 (FIG. 1C) into the well region 104. For example, if the well region 104 is doped with at least one P-type dopant (e.g., boron) and the dopant diffusion regions 118 (FIG. 1C) are doped with at least one N-type dopant (e.g., phosphorus and arsenic), the fluorine-doped region 116 may impede the diffusion of the P-type dopant into the dopant diffusion regions 118 and may also impede the diffusion of the N-type dopants into the well region 104. Accordingly, the LDD regions 120 and the source/drain regions 122 may be substantially free of dopants (e.g., P-type dopants, such as boron) present within the well region 104, and the well region 104 may be substantially free of dopants (e.g., N-type dopants, such as phosphorus and arsenic) present within the LDD regions 120 and the source/drain regions 122. Impeding the diffusion of dopants from the well region 104 into the dopant diffusion regions 118 (FIG. 1C), and vice versa, during the thermal treatment process by way of the fluorine-doped region 116 may provide the apparatus 100 with enhanced electrical properties (e.g., reduced junction leakage, reduced channel resistance, increased drive current, improved row decoder enable (rdE) signals) as compared to many conventional apparatuses formed through conventional methods.

The apparatus 100 at the processing stage processing stage depicted in FIG. 1D (e.g., following the formation of the LDD regions 120 and the source/drain regions 122) includes multiple transistors 126 (e.g., field effect transistors). The transistors 126 may each individually include a pair of the source/drain regions 122, a pair of the LDD regions 120 underlying the pair of the source/drain regions 122, one of the gate structures 110 laterally intervening between each pair of the source/drain regions 122 and each pair of the LDD regions 120, and a channel region 124 (depicted as an arrowed line) extending between the pair of the LDD regions 120 as a current flow path travelling around lower portions of the first filled trenches 106a within the well region 104.

Thus, in accordance with embodiments of the disclosure, a method of forming an apparatus comprises forming filled trenches within a semiconductive structure having a well region comprising one or more dopants. The filled trenches extend into the well region and each individually comprises a conductive gate structure and a dielectric liner intervening between the conductive gate structure and the semiconductive structure. A fluorine-doped region is formed at junctions between the well region and additional regions of the semiconductive structure overlying the well region. The additional regions of the semiconductive structure are doped with one or more additional dopants having a different conductivity type than that of the one or more dopants of the well region after forming the fluorine-doped region. The semiconductive structure is annealed after doping the additional regions thereof.

Furthermore, an apparatus according to embodiments of the disclosure comprises a semiconductive structure and filled trenches vertically extending into the semiconductive structure. The semiconductive structure comprises a well region, a fluorine-enriched region overlying the well region, and at least one additional region overlying the fluorine-doped region. The well region comprises a semiconductive material doped with at least one first dopant. The fluorine-enriched region comprises the semiconductive material doped with fluorine. The at least one additional region comprises the semiconductive material doped with at least one second dopant having a different conductivity type than the at least one first dopant. The filled trenches each individually comprise a conductive structure and a dielectric liner intervening between the conductive structure and the semiconductive structure. The conductive structure comprises a lower portion within vertical boundaries of the well region, and an upper portion within vertical boundaries of the at least one additional region.

Following the formation of the LDD regions 120 and the source/drain regions 122 (and, hence, the transistors 126), the apparatus 100 may be subjected to additional processing. For example, referring to FIG. 1E, a dielectric material 128 may be formed on or over the uppermost surfaces of the source/drain regions 122, the dielectric liners 108, and the insulating caps 114; conductive interconnects 130 may be formed to vertically extend through the dielectric material 128 and to the source/drain regions 122; storage node structures 132 (e.g., capacitor structures) may be formed over and in electrical communication with some of the conductive interconnects 130; and digit lines 134 (e.g., bit lines, data lines) may be formed over and in electrical communication with other of the conductive interconnects 130.

The dielectric material 128 may comprise one or more of a dielectric oxide material (e.g., $SiO_2$; phosphosilicate glass; borosilicate glass; borophosphosilicate glass; fluorosilicate glass; aluminum oxide; high-k oxides, such as $HfO_x$; a combination thereof), a dielectric nitride material (e.g., SiN), a dielectric oxynitride material (e.g., SiON), a dielectric carbonitride material (e.g., SiCN), a dielectric carboxynitride material (e.g., SiOCN), and amphorous carbon. A material composition of the dielectric material 128 may be substantially the same as or may be different than that of one or more of the insulative caps 114 and the dielectric liners 108. In some embodiments, the dielectric material 128 comprises SiN.

Figure 1E:
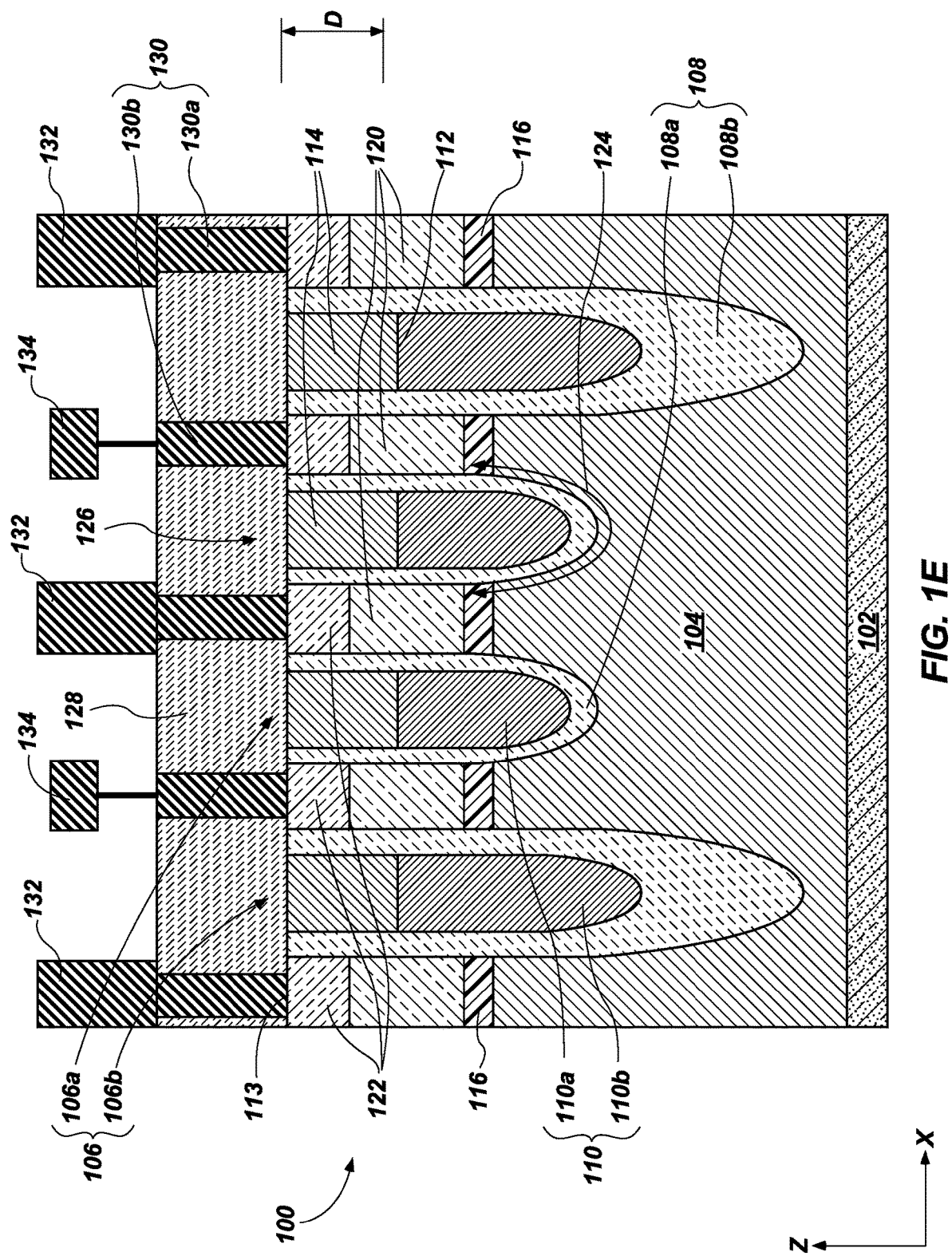

The conductive interconnects 130 may each individually be formed of and include an electrically conductive material, such as one or more of a metal, an alloy, a conductive metal oxide, a conductive metal nitride, a conductive metal silicide, and a conductively doped semiconductive material. By way of non-limiting example, the conductive interconnects 130 may individually comprise one or more of Ru, W, WN, Ni, Ta, TaN, TaSi, Pt, Cu, Ag, Au, Al, Mo, Ti, TiN, TiSi, TiSiN, TiAlN, MoN, Ir, $IrO_x$, $RuO_x$, RuTiN, and conductively doped silicon. As shown in FIG. 1E, the conductive interconnects 130 may include first conductive interconnects 130a extending between and electrically coupling the storage node structures 132 and a portion of the source/drain regions 122 (e.g., those source/drain regions 122 serving as sources) of the transistors 126, and second conductive interconnects 130b extending between and electrically coupling the digit lines 134 and a portion of the source/drain regions 122 (e.g., those source/drain regions 122 serving as drains) of the transistors 126.

The storage node structures 132 may be configured to store a charge representative of a programmable logic state. For example, a charged state of the storage node structures 132 may represent a first logic state (e.g., a logic 1), and an uncharged state of the storage node structures 132 may represent a second logic state (e.g., a logic 0). In some embodiments, the storage node structures 132 comprise a dielectric material configured to storage a charge associated with a logic state. The dielectric material may, for example, comprise one or more of include silicon dioxide, silicon nitride, polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT), etc.), and a high-k dielectric material. In some embodiments, the storage node structures 132 comprise $ZrO_2$.

The digit lines 134 may each individually be formed of and include an electrically conductive material, such as one or more of a metal, an alloy, a conductive metal oxide, a conductive metal nitride, a conductive metal silicide, and a conductively doped semiconductive material. By way of non-limiting example, the digit lines 134 may individually comprise one or more of Ru, W, WN, Ni, Ta, TaN, TaSi, Pt, Cu, Ag, Au, Al, Mo, Ti, TiN, TiSi, TiSiN, TiAlN, MoN, Ir, $IrO_x$, $RuO_x$, RuTiN, and conductively doped silicon. The digit lines 134 may be in electrical communication with at least one control logic structure. In some embodiments, the digit lines 134 extend parallel to one another in a lateral direction substantially perpendicular (e.g., orthogonal) to another lateral direction in which the gate structures 110 extend.

The dielectric material 128, the conductive interconnects 130, the storage node structures 132, and the digit lines 134 may each individually be formed using conventional processes (e.g., conventional deposition processes, such as one or more of in situ growth, spin-on coating, blanket coating, CVD, ALD, and PVD; conventional patterning and material removal processes, such as conventional alignment processes, conventional photolithographic exposure processes, conventional development processes, conventional etching processes) and conventional processing equipment, which are not described in detail herein.

Figure 2:
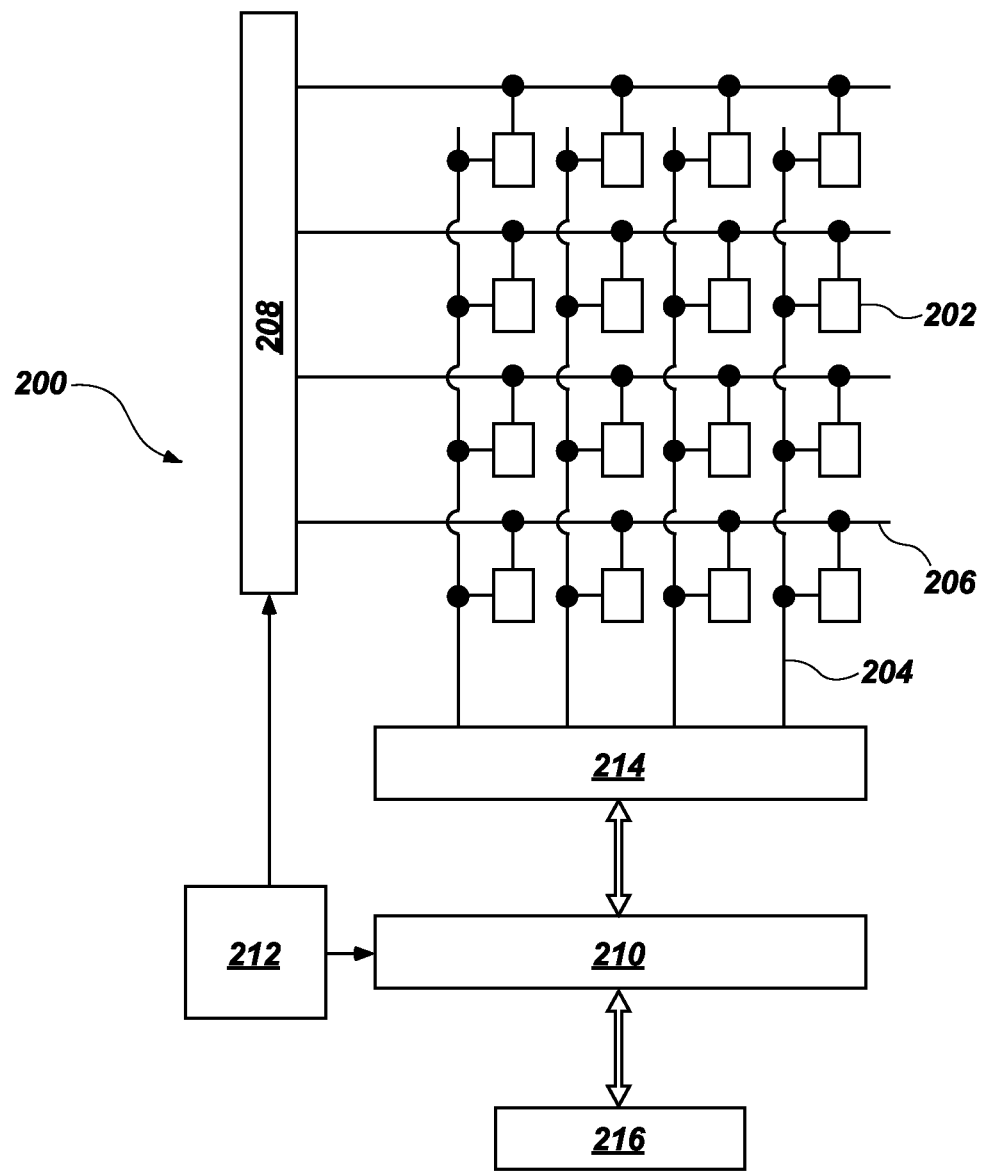
FIG. 2 is a functional block diagram of a memory device, in accordance with an embodiment of the disclosure.

FIG. 2 illustrates a functional block diagram of a memory device 200 (e.g., a DRAM device), in accordance with an embodiment of the disclosure. The memory device 200 may include, for example, an embodiment of the apparatus 100 previously described herein. As shown in FIG. 2, the memory device 200 may include memory cells 202, digit lines 204, word lines 206, a row decoder 208, a column decoder 210, a memory controller 212, a sense device 214, and an input/output device 216.

The memory cells 202 of the memory device 200 are programmable to at least two different logic states (e.g., logic 0 and logic 1). Each memory cell 202 may individually include a storage node structure (e.g., the storage node structure 132 previously described with reference to FIG. 1E) and transistor (e.g., the transistor 126 previously described with reference to FIG. 1E). The storage node structure stores a charge representative of the programmable logic state (e.g., a charged capacitor may represent a first logic state, such as a logic 1; and an uncharged capacitor may represent a second logic state, such as a logic 0) of the memory cell 202. The transistor grants access to the capacitor upon application (e.g., by way of one of the word lines 206) of a minimum threshold voltage to a semiconductive channel (e.g., the channel region 124 previously described with reference to FIG. 1E) thereof for operations (e.g., reading, writing, rewriting) on the storage node structure.

The digit lines 204 (e.g., the digit lines 134 previously described with reference to FIG. 1E) are connected to the storage node structures of the memory cells 202 by way of the transistors of the memory cells 202. The word lines 206 extend perpendicular to the digit lines 204, and are connected to gates (e.g., the gate structures 110 previously described with reference to FIGS. 1A-1E) of the transistors of the memory cells 202. Operations may be performed on the memory cells 202 by activating appropriate digit lines 204 and word lines 206. Activating a digit line 204 or a word line 206 may include applying a voltage potential to the digit line 204 or the word line 206. Each column of memory cells 202 may individually be connected to one of the digit lines 204, and each row of the memory cells 202 may individually be connected to one of the word lines 206. Individual memory cells 202 may be addressed and accessed through the intersections (e.g., cross points) of the digit lines 204 and the word lines 206.

The memory controller 212 may control the operations of memory cells 202 through various components, including the row decoder 208, the column decoder 210, and the sense device 214. The memory controller 212 may generate row address signals that are directed to the row decoder 208 to activate (e.g., apply a voltage potential to) predetermined word lines 206, and may generate column address signals that are directed to the column decoder 210 to activate (e.g., apply a voltage potential to) predetermined digit lines 204.

The memory controller 212 may also generate and control various voltage potentials employed during the operation of the memory device 200. In general, the amplitude, shape, and/or duration of an applied voltage may be adjusted (e.g., varied), and may be different for various operations of the memory device 200.

During use and operation of the memory device 200, after being accessed, a memory cell 202 may be read (e.g., sensed) by the sense device 214. The sense device 214 may compare a signal (e.g., a voltage) of an appropriate digit line 204 to a reference signal in order to determine the logic state of the memory cell 202. If, for example, the digit line 204 has a higher voltage than the reference voltage, the sense device 214 may determine that the stored logic state of the memory cell 202 is a logic 1, and vice versa. The sense device 214 may include transistors and amplifiers to detect and amplify a difference in the signals (commonly referred to in the art as "latching"). The detected logic state of a memory cell 202 may be output through the column decoder 210 to the input/output device 216. In addition, a memory cell 202 may be set (e.g., written) by similarly activating an appropriate word line 206 and an appropriate digit line 204 of the memory device 200. By controlling the digit line 204 while the word line 206 is activated, the memory cell 202 may be set (e.g., a logic value may be stored in the memory cell 202). The column decoder 210 may accept data from the input/output device 216 to be written to the memory cells 202. Furthermore, a memory cell 202 may also be refreshed (e.g., recharged) by reading the memory cell 202. The read operation will place the contents of the memory cell 202 on the appropriate digit line 204, which is then pulled up to full level (e.g., full charge or discharge) by the sense device 214. When the word line 206 associated with the memory cell 202 is deactivated, all of memory cells 202 in the row associated with the word line 206 are restored to full charge or discharge.

Thus, a memory device according to embodiments of the disclosure comprises a memory controller, a row decoder operably coupled to the memory controller, a column decoder operably coupled to the memory controller, word lines operably coupled to the row decoder, digit lines operably coupled to the column decoder, and memory cells electrically coupled to the word lines and the digit lines. Each memory cell comprises a transistor electrically coupled at least one of the word lines, and a storage node structure electrically coupled to the transistor. The transistor comprises a gate electrode, a channel, lightly doped drain regions, source/drain regions, and a dielectric liner. The gate electrode is within a filled trench vertically extending into a semiconductive structure. The channel extends around portions of the gate electrode within a well region of the semiconductive structure. The lightly doped drain regions neighbor opposing sides of the gate electrode and overlie a fluorine-doped region overlying the well region. The source/drain regions neighbor the opposing sides of the gate electrode and overlie the lightly doped drain regions. The dielectric liner is between the gate electrode and each of the channel, the lightly doped drain regions, and the source/drain regions.

Figure 3:
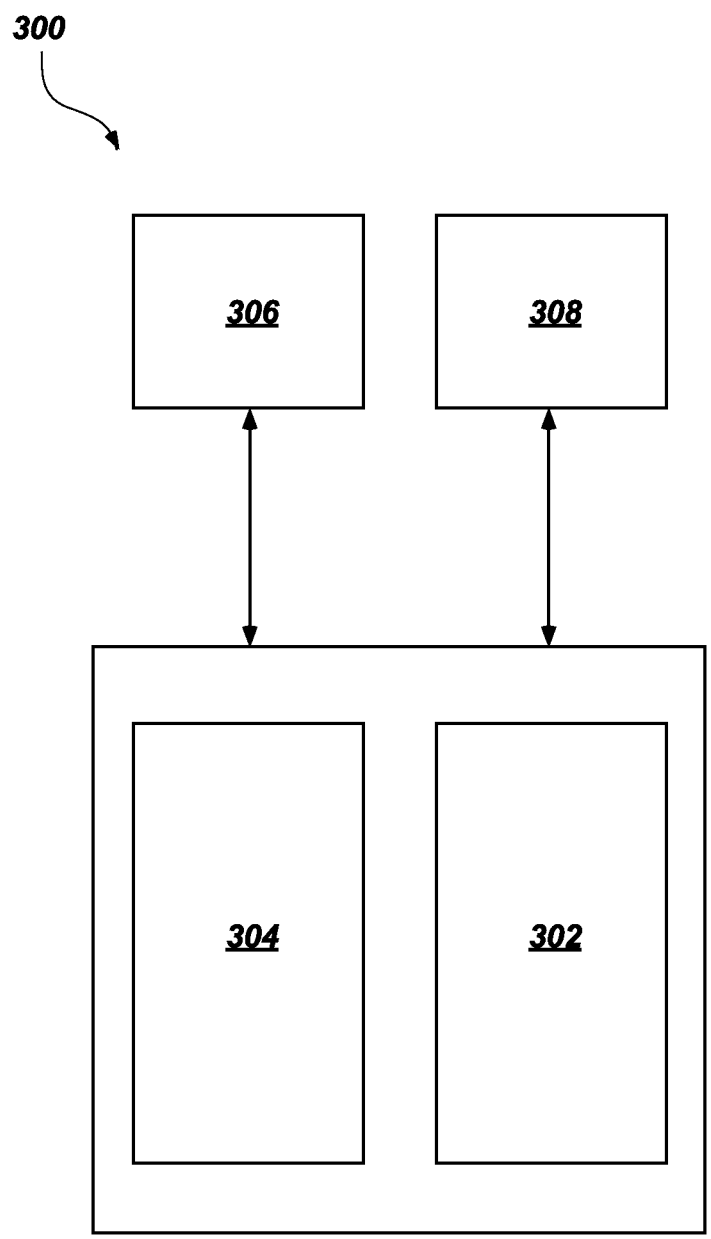
FIG. 3 is a schematic block diagram of an electronic system, in accordance with an embodiment of the disclosure.

Apparatuses (e.g., the apparatus 100) and semiconductor devices (e.g., the memory device 200) in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of one or more of an apparatus (e.g., the apparatus 100) and a semiconductor device (e.g., the memory device 200) previously described herein. The electronic system 300 may further include at least one electronic signal processor device 304 (often referred to as a "microprocessor"). The electronic signal processor device 304 may, optionally, include an embodiment of an apparatus (e.g., the apparatus 100) and a semiconductor device (e.g., the memory device 200) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, an electronic system according to embodiments of the disclosure comprises an input device, an output device, a processor device operably coupled to the input device and the output device, and a memory device operably coupled to the processor device. The memory device comprises a semiconductive structure and filled trenches vertically extending into the semiconductive structure. The semiconductive structure comprises a P-type well region, N-type lightly doped drain regions overlying the P-type well region, and a fluorine-doped region vertically intervening between the P-type well region and the N-type lightly doped drain regions. The filled trenches each individually comprise a gate electrode and a dielectric liner. The gate electrode comprises a first portion within vertical boundaries of the P-type well region, a second portion overlying the first portion and within vertical boundaries of the N-type lightly doped drain regions. The dielectric liner intervenes between the gate electrode and each of the P-type well region, the fluorine-doped region, and the N-type lightly doped drain regions of the semiconductive structure.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:
1. An apparatus, comprising:
a semiconductive structure, comprising:
a well region comprising a semiconductive material doped with at least one first dopant;

a fluorine-enriched region directly vertically over the well region and comprising the semiconductive material doped with fluorine;

lightly doped drain regions directly vertically over the fluorine-doped region and comprising the semiconductive material doped with at least one second dopant having a different conductivity type than the at least one first dopant; and source/drain regions directly vertically over the first doped regions and comprising the semiconductive material doped with a relatively greater amount of the at least one second dopant per unit volume than the lightly doped drain regions;

first filled trenches vertically extending into the semiconductive structure and each individually comprising:
- a first conductive structure comprising:
  - a lower vertical boundary within vertical boundaries of the well region; and
  - an upper vertical boundary vertically below upper vertical boundaries and vertically above lower vertical boundaries of the lightly doped drain regions; and
- a first dielectric liner intervening between the first conductive structure and each of the well region, the lightly doped drain regions, and the source/drain regions of the semiconductive structure; and second filled trenches vertically extending into the semiconductive structure and each individually comprising:
- a second conductive structure comprising:
  - a lower vertical boundary within vertical boundaries of the well region; and
  - an upper vertical boundary vertically below the upper vertical boundaries and vertically above the lower vertical boundaries of the lightly doped drain regions; and
- a second dielectric liner intervening between the second conductive structure and each of the well region, the lightly doped drain regions, and the source/drain regions of the semiconductive structure, the second dielectric liner vertically extending to a greater depth within the semiconductive structure than the first dielectric liner of the first filled trenches.

2. The apparatus of claim 1, wherein:
the at least one first dopant comprises at least one P-type dopant; and
the at least one second dopant comprises at least one N-type dopant.

3. The apparatus of claim 1, wherein:
the well region is substantially free of the at least one second dopant; and
the lightly doped drain regions and the source/drain regions are substantially free of the at least one first dopant.

4. The apparatus of claim 1, further comprising additional fluorine distributed within the well region, the lightly doped drain regions, and the source/drain regions of the semiconductive structure, atomic concentrations of the additional fluorine within the well region, the lightly doped drain regions, and the source/drain regions less than an atomic concentration of the fluorine within the fluorine-enriched region.

5. The apparatus of claim 1, wherein:
the at least one first dopant comprises boron; and
the at least one second dopant comprises phosphorus and arsenic.

6. The apparatus of claim 1, further comprising:
conductive interconnect structures over and electrically coupled to the source/drain regions;
storage node structures over and electrically coupled to some of the conductive interconnect structures; and
digit lines over and electrically coupled to some other of the conductive interconnect structures.

7. The apparatus of claim 1, wherein:
each of the first filled trenches individually further comprises a first insulative cap over the first conductive structure thereof; and
each of the second filled trenches individually further comprises a second insulative cap over the first conductive structure thereof.

8. The apparatus of claim 1, wherein each of the first filled trenches individually further comprises a first dielectric cap structure vertically overlying the first conductive structure and having a lower vertical boundary within vertical boundaries of the source/drain regions.

9. The apparatus of claim 1, wherein the second conductive structure of the second filled trenches vertically extends to a greater depth within the semiconductive structure than the first conductive structure of the first filled trenches.

10. The apparatus of claim 1, wherein:
the second filled trenches comprise two of the second filled trenches; and
the first filled trenches comprise two of the first filled trenches horizontally interposed between the two of the second filled trenches.

11. A memory device, comprising:
a memory controller;
a row decoder operably coupled to the memory controller;
a column decoder operably coupled to the memory controller;
word lines operably coupled to the row decoder;
digit lines operably coupled to the column decoder;
memory cells electrically coupled to the word lines and the digit lines, each memory cell comprising:
- a transistor electrically coupled at least one of the word lines, the transistor comprising:
  - a gate electrode within a filled trench vertically extending into a semiconductive structure;
  - a channel extending around portions of the gate electrode within a well region of the semiconductive structure, a lower vertical boundary of the gate electrode within vertical boundaries of the well region of the semiconductive structure;
  - lightly doped drain regions horizontally neighboring opposing sides of the gate electrode and vertically overlying a fluorine-doped region overlying the well region, an upper vertical boundary of the gate electrode under upper vertical boundaries and over lower vertical boundaries of the lightly doped drain regions;
  - source/drain regions horizontally neighboring the opposing sides of the gate electrode and vertically overlying the lightly doped drain regions;
  - a dielectric liner between the gate electrode and each of the channel, the lightly doped drain regions, and the source/drain regions; and
- a storage node structure electrically coupled to the transistor; and an additional filled trench horizontally neighboring the filled trench and vertically extending into
the semiconductive structure, the additional filled trench comprising:
an additional electrode vertically extending to a greater depth within the semiconductive structure than the gate electrode within the filled trench; and
an additional dielectric liner interposed between the additional electrode and the semiconductive structure, the additional dielectric liner vertically extending to a greater depth within the semiconductive structure than the dielectric liner within the filled trench.

12. An electronic system, comprising:
an input device;
an output device;
a processor device operably coupled to the input device and the output device; and
a memory device operably coupled to the processor device and comprising:
a semiconductive structure, comprising:
a P-type well region;
a fluorine-doped region directly vertically overlying P-type well region;
N-type lightly doped drain regions directly vertically overlying the fluorine-doped region; and
N-type source/drain regions directly vertically overlying the N-type lightly doped drain regions and comprising greater an atomic concentrations of one or more N-type dopants than the N-type lightly doped drain regions;
first filled trenches vertically extending into the semiconductive structure and each individually comprising:
a first gate electrode comprising:
a lower vertical boundary within vertical boundaries of the P-type well region; and
an upper vertical boundary under upper vertical boundaries and over lower vertical boundaries of the N-type lightly doped drain regions; and
a first dielectric liner intervening between the first gate electrode and each of the P-type well region, the fluorine-doped region, and the N-type lightly doped drain regions of the semiconductive structure; and
second filled trenches vertically extending into the semiconductive structure and each individually comprising:
a second gate electrode comprising:
a lower vertical boundary within the vertical boundaries of the P-type well region; and
an upper vertical boundary under the upper vertical boundaries and over the lower vertical boundaries of the N-type lightly doped drain regions; and
a second dielectric liner intervening between the second gate electrode and each of the P-type well region, the fluorine-doped region, and the N-type lightly doped drain regions of the semiconductive structure, the second dielectric liner extending relatively deeper within the semiconductive structure than the first dielectric liner of the first filled trenches.

13. The electronic system of claim 12, wherein the memory device comprises a DRAM device.

* * * * *

UNITED STATES PATENT AND TRADEMARK OFFICE
CERTIFICATE OF CORRECTION

PATENT NO. : 11,189,623 B2
APPLICATION NO. : 16/223506
DATED : November 30, 2021
INVENTOR(S) : Oscar O. Enomoto et al.

It is certified that error appears in the above-identified patent and that said Letters Patent is hereby corrected as shown below:

In the Specification
Column 1,    Line 53,    change "ran" to --can--
Column 1,    Line 57,    change "N-type: dopants" to --N-type dopants--
Column 10,   Line 17,    change "P$^{3}$" to --P$^{3-}$--

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*